(12) United States Patent
Pillarisetty et al.

(10) Patent No.: US 8,846,480 B2
(45) Date of Patent: Sep. 30, 2014

(54) CARRIER MOBILITY IN SURFACE-CHANNEL TRANSISTORS, APPARATUS MADE THEREWITH, AND SYSTEM CONTAINING SAME

(71) Applicants: Ravi Pillarisetty, Portland, OR (US); Mantu Hudait, Portland, OR (US); Marko Radosavljevic, Beaverton, OR (US); Gilbert Dewey, Hillsboro, OR (US); Jack T. Kavalieros, Portland, OR (US)

(72) Inventors: Ravi Pillarisetty, Portland, OR (US); Mantu Hudait, Portland, OR (US); Marko Radosavljevic, Beaverton, OR (US); Gilbert Dewey, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/773,558

(22) Filed: Feb. 21, 2013

(65) Prior Publication Data
US 2013/0164898 A1 Jun. 27, 2013

Related U.S. Application Data

(62) Division of application No. 12/454,354, filed on May 15, 2009, now Pat. No. 8,384,128.

(51) Int. Cl.
H01L 29/66 (2006.01)
H01L 29/10 (2006.01)
H01L 29/205 (2006.01)

(52) U.S. Cl.
CPC ...... *H01L 29/1054* (2013.01); *H01L 29/66522* (2013.01); *H01L 29/205* (2013.01); *H01L 29/66477* (2013.01)
USPC .......................................... 438/289; 438/406

(58) Field of Classification Search
CPC .................... H01L 29/66477; H01L 29/1054; H01L 29/205
USPC .................................................. 438/289, 406
See application file for complete search history.

(56) References Cited

U.S. PATENT DOCUMENTS

| | | | |
|---|---|---|---|
| 6,633,066 B1 * | 10/2003 | Bae et al. | 257/347 |
| 8,017,933 B2 * | 9/2011 | Pillarisetty et al. | 257/24 |
| 2002/0007430 A1 | 1/2002 | Kawasaki et al. | |
| 2004/0227154 A1 | 11/2004 | Chu et al. | |

* cited by examiner

*Primary Examiner* — Laura Menz
(74) *Attorney, Agent, or Firm* — Blakely, Sokoloff, Taylor & Zafman LLP

(57) ABSTRACT

A surface channel transistor is provided in a semiconductive device. The surface channel transistor is either a PMOS or an NMOS device. Epitaxial layers are disposed above the surface channel transistor to cause an increased bandgap phenomenon nearer the surface of the device. A process of forming the surface channel transistor includes grading the epitaxial layers.

14 Claims, 6 Drawing Sheets

CARRIER MOBILITY IN SURFACE-CHANNEL TRANSISTORS, APPARATUS MADE THEREWITH, AND SYSTEM CONTAINING SAME

This is a Divisional Application of Ser. No. 12/454,354 filed May 15, 2009 which is presently pending.

TECHNICAL FIELD

A variety of electronic and optoelectronic devices use surface channel transistors for microelectronic applications. Surface layers capable of using the properties of III-V materials may host a variety of high performance electronic devices such as complementary metal oxide semiconductor (CMOS) and quantum well (QW) transistors. The growth of III-V materials upon silicon substrates, however, presents many challenges. Challenges involved with such devices include adequate short-channel effect (SCE) and gate-length (Lg) scalability.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

A surface channel transistor device utilizes bandgap engineering to create a sequence of compositional grading near the semiconductor/dielectric interface. Disclosed techniques allow for the carrier wavefunction to shift away from the dielectric interface to improve dielectric density of interface traps (Dit) impurity scattering. Disclosed techniques provide useful mobility gains over conventional surface channel devices, particularly in systems with poor oxide quality, such as in III-V materials.

Disclosed embodiments address improving carrier mobility in a surface channel III-V device through bandgap engineering. A compositionally graded sequence of thin layers is formed near the semiconductor surface. In an embodiment, the bandgap is graded from smaller to larger towards the surface. As a result, the quantum confinement of the carrier wave function is effectively weaker. Similarly the centroid of the wavefunction shifts the deeper into the semiconductor material, and farther from the semiconductor/dielectric interface.

Figure 1A:
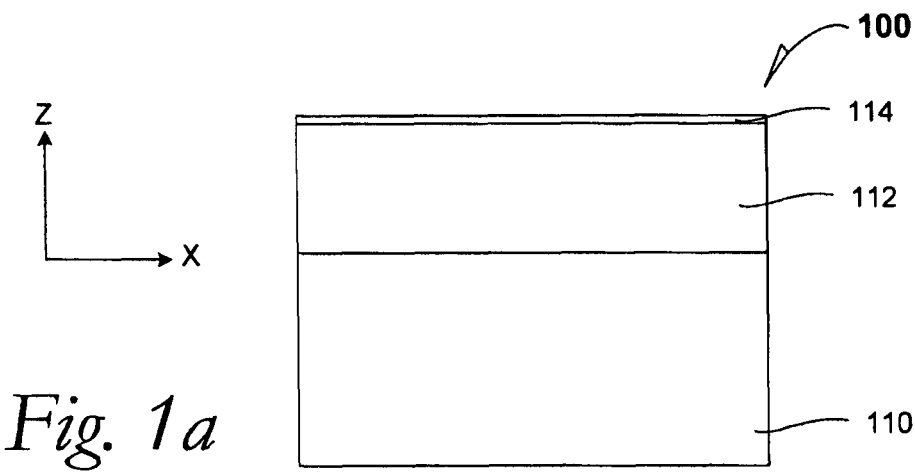
FIG. 1a is a cross-section elevation of an integrated circuit device according to an example embodiment.

FIG. 1a is a cross-section elevation of an integrated circuit device 100 according to an example embodiment. The integrated circuit device 100 may be used to form an NMOS or PMOS device on a semiconductive substrate 110. In an embodiment, the semiconductive substrate 110 is a high resistivity n or p-type (100) off-oriented Si substrate. In an embodiment, the semiconductive substrate 110 has a vicinal surface that is prepared by off-cutting the semiconductive substrate 110 from an ingot. In an embodiment, the semiconductive substrate 110 is off cut at an angle between 2 and 8 degrees towards the [110] direction to produce a surface that may have terraces according to an embodiment. In an embodiment, different off-cut orientations are used. In an embodiment, the semiconductive substrate 110 is 4° off-cut silicon.

In an embodiment, the semiconductive substrate 110 is provided without an off-cut orientation. In any event, an off-cut semiconductive substrate 110 or other substrate preparation may provide for device isolation and may also reduce anti-phase domains in anti-phase boundaries. The semiconductive substrate 110 may have a resistivity in a range from 1 ohm (Ω) to 50 kΩ.

A first structure 112 is disposed on the semiconductive substrate 110 according to an embodiment. In an embodiment, the semiconductive substrate 110 may be separated from the first structure 112 such as by a dielectric material such that the first structure 112 is a semiconductor on insulator (SOI) first structure 112. In an embodiment, the first structure 112 is an epitaxial first structure 112 such as an $In_{0.7}Ga_{0.3}As$ material that has been formed on a semiconductive substrate 110 of InP. In an embodiment, the first structure 112 is configured to be a quantum well channel.

A first layer 114 of an epitaxial second structure 120 (see FIG. 1b) is formed above (in the Z-direction) and on the epitaxial first structure 112. Hereinafter, the first structure 112 is referred to as an epitaxial first structure 112, but it is also understood that it may not be an epitaxially formed first structure 112 such as an SOI structure.

Figure 1B:
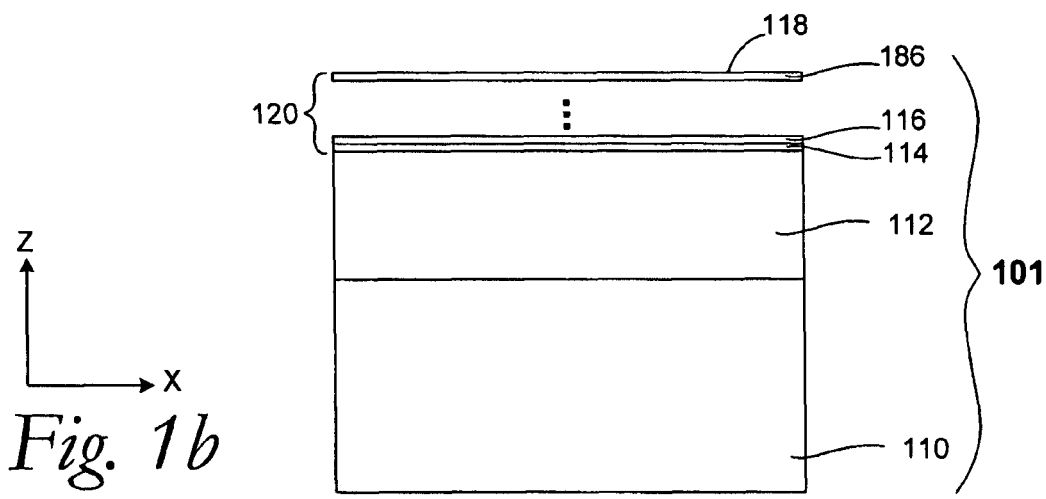
FIG. 1b is a cross-section elevation of the integrated circuit device depicted in FIG. 1a after further processing according to an embodiment.

FIG. 1b is a cross-section elevation of the integrated circuit device depicted in FIG. 1a after further processing according to an embodiment. The semiconductor device 101 has been processed with a sequence of compositional grading above the epitaxial first structure 112. A second layer 116 and a subsequent layer 186 are depicted, which, included with the first layer 114 are the epitaxial second structure 120. Compositional grading of the first-through subsequent layers 114 and 186, respectively, is accomplished in order to increase the bandgap near the top 118 of the epitaxial second structure 120, which will be the semiconductor/dielectric interface.

In an embodiment, formation of the epitaxial second structure 120 is carried out by molecular beam epitaxy (MBE) such that atomic layers are sequentially grown above the epitaxial first structure 112. In an embodiment, MBE is carried out at temperatures between 400° C. and 500° C. In an embodiment, formation of the epitaxial second structure 120 is carried out by chemical vapor deposition (CVD) such that layers are sequentially grown above the epitaxial first structure 112. In an embodiment, formation of the epitaxial second structure 120 is carried out by metal-organic chemical vapor deposition (MOCVD) such that atomic layers are sequentially grown above the epitaxial first structure 112. In an embodiment, formation of the epitaxial second structure 120 is carried out by ultra-high chemical vapor deposition (UH-CVD) such that atomic layers are sequentially grown above the epitaxial first structure 112. In an embodiment, formation of the epitaxial second structure 120 is carried out by liquid-phase epitaxial deposition (LPE) such that atomic layers are sequentially grown above the epitaxial first structure 112.

Several quantitative layer embodiments are disclosed. In an embodiment, the number of layers that make up the epitaxial second structure 120 is two including a first layer and a subsequent layer. In an embodiment, the number of layers that make up the epitaxial second structure 120 is three including a first layer, a second layer, and a subsequent layer. In an embodiment, the subsequent layer 186 is up to a $30^{th}$ layer in a sequence after the first layer 114. In an embodiment, the subsequent layer 186 is up to a $25^{th}$ layer in a sequence after the first layer 114. In an embodiment, the subsequent layer 186 is up to a $20^{th}$ layer in a sequence after the first layer 114. In an embodiment, the subsequent layer 186 is up to a $15^{th}$ layer in a sequence after the first layer 114. In an embodiment, the subsequent layer 186 is up to a $10^{th}$ layer in a sequence after the first layer 114. In an embodiment, the subsequent layer 186 is up to a $5^{th}$ layer in a sequence after the first layer 114.

Further to quantitative layer embodiments, the total thickness of an epitaxial second structure 120 may be between 20 nanometer (nm) and 100 nm. Consequently, a 30-layer sequential composite may be between 20 nm thick and 100 nm thick. Similarly, a 5-layer sequential composite may be between 20 nm thick and 100 nm thick. Persons of ordinary skill in the art may now realize there are several permutations of layer number and epitaxial second structure thickness embodiments.

It should be appreciated that the quality of the epitaxial second structure 120 as a mechanism to shift the carrier wavefunction away from a dielectric interface above the semiconductor device 101 may be affected by the specific structure of the epitaxial second structure 120 and not just the number of layers and the ultimate thickness between the first layer 114 and the subsequent layer 186. Thus, both quantitative effects as in the number and thickness of graded sequential layers may affect performance, as well as qualitative effects as in the chemical composition of each graded sequential layer.

Figure 1C:
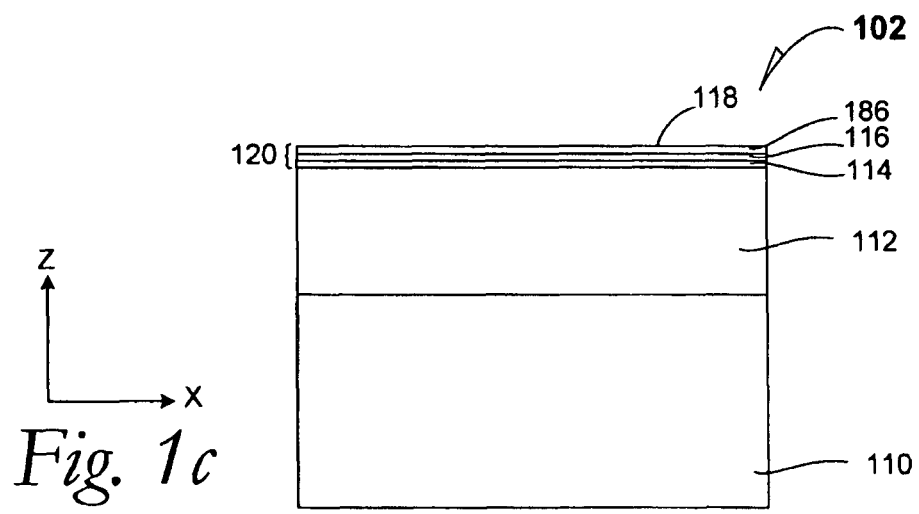
FIG. 1c is a cross-section elevation of the integrated circuit device depicted in FIG. 1b after further processing according to an embodiment.

FIG. 1c is a cross-section elevation of the integrated circuit device depicted in FIG. 1b after further processing according to an embodiment. The semiconductor device 102 is depicted with the sequence of compositional grading above the epitaxial first structure 112 where the top 118 of the epitaxial second structure 120 is the subsequent layer 186. FIG. 1c is in simplified form according to an embodiment for illustrative purposes. It may now be understood the semiconductive first structure such as the epitaxial first structure 112 is of a semiconductive first type and the subsequent layer of an epitaxial second structure such as the epitaxial second structure 120 is of a semiconductive second type. The gradation between the semiconductive first type and the semiconductive second type is set forth further in this disclosure.

Compositional grading of the bandgap allows the carrier wave function during strong inversion (i.e. ON state condition) in the epitaxial first structure 112 to shift deeper into the epitaxial first structure 112 and farther from a dielectric interface that will be formed at the top 118 of the epitaxial second structure 120. Consequently, interface impurity scattering from Dit at the dielectric interface is reduced as the epitaxial first structure 112 is used as the inversion region. The disclosed compositional grading embodiments may be used for III-V material semiconductive devices. In an embodiment, compositional grading may be used for silicon-based semiconductive devices.

In an embodiment, the semiconductive substrate 110 is an indium-phosphorus (InP) body and the epitaxial first structure 112 is a III-V material of $In_{0.7}Ga_{0.3}As$. The epitaxial second structure 120 is a sequence of epitaxially grown layers where the first layer 114 may be $In_{0.68}Ga_{0.32}As$, the second layer 116 may be $In_{0.66}Ga_{0.34}As$, and the subsequent layer 168 may be $In_{0.3}Ga_{0.7}As$. As a consequence, the first layer 114 is chemically more similar to the epitaxial first structure 112 than to the subsequent layer 168. "Chemically more similar" in this sense means the semiconductive quality of a first structure 112 and a first layer 114 of a second structure 120 are closer in behavior to each other than to a subsequent layer 168 of the second structure. It can be seen in this example embodiment that the compositions $In_{0.7}Ga_{0.3}As$ (item 112) and $In_{0.68}Ga_{0.32}As$ (item 114) are chemically more similar that the composition $In_{0.3}Ga_{0.7}As$ (item 168). It can now be appreciated that a chemically more similar relationship among three given semiconductive structures need not only be based upon an identical three-element chemistry with compositional variations. Where more than two layers exist in disclosed embodiments, "chemically more similar" also requires a gradation from the first layer 112 to the subsequent layer 168. Selected gradation embodiments are set forth in connection with FIG. 5.

Figure 2:
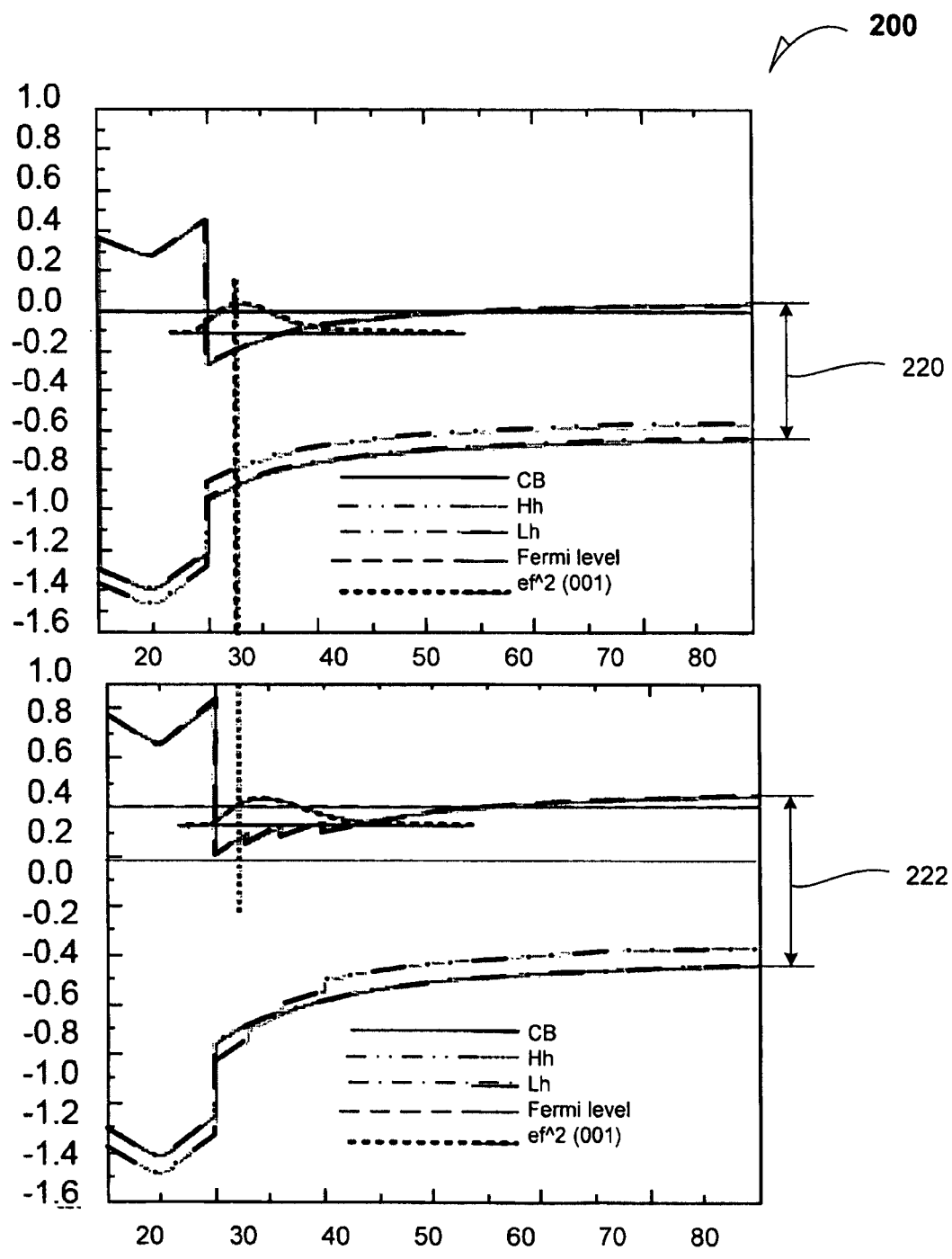
FIG. 2 is a band diagram comparison of a semiconductor device embodiment to another semiconductor device.

FIG. 2 is a band diagram 200 comparison of a semiconductor device embodiment to another semiconductor device. A Schrödinger-Poisson solution of a spatial redistribution of a confined carrier population in various subbands is depicted such as the epitaxial first structure 112 depicted in FIG. 1b at a gate voltage, $V_g$=0V. The band diagram 200 shows a surface channel $In_{0.7}Ga_{0.3}As$ transistor (upper graphic) compared with a transistor that has an epitaxial second structure with a gradation (lower graphic). The epitaxial second structure begins chemically similar to the $In_{0.7}Ga_{0.3}As$ material, but results with a $In_{0.3}Ga_{0.7}As$ subsequent layer at the top (e.g. subsequent layer 168 at the top 118 in FIG. 2b). It can be seen that the wavefunction has shifted about 50'ngstrom from the dielectric interface. The band gap 222 for the graded semiconductive device embodiment is about 50'larger than the bandgap 220 for the other semiconductive device.

In an embodiment, graded doping with sequences of layers is carried out according to the structure depicted in the Table. It can be seen in the Table, that a 21-layer graded doping is formed. The element amounts set forth in the columns represent stoichiometric percentages based on an arsenic stoichiometery of unity.

| Layer number | In | Ga | As |
| --- | --- | --- | --- |
| subsequent | 0.3 | 0.7 | 1 |
| 20 | 0.32 | 0.68 | 1 |
| 19 | 0.34 | 0.66 | 1 |
| 18 | 0.36 | 0.64 | 1 |
| 17 | 0.38 | 0.62 | 1 |
| 16 | 0.4 | 0.6 | 1 |
| 15 | 0.42 | 0.58 | 1 |
| 14 | 0.44 | 0.56 | 1 |
| 13 | 0.46 | 0.54 | 1 |
| 12 | 0.48 | 0.52 | 1 |
| 11 | 0.50 | 0.5 | 1 |
| 10 | 0.52 | 0.48 | 1 |
| 9 | 0.54 | 0.46 | 1 |
| 8 | 0.56 | 0.44 | 1 |
| 7 | 0.58 | 0.42 | 1 |
| 6 | 0.6 | 0.4 | 1 |
| 5 | 0.62 | 0.38 | 1 |
| 4 | 0.64 | 0.36 | 1 |
| 3 | 0.66 | 0.64 | 1 |
| 2 | 0.68 | 0.32 | 1 |
| first | 0.7 | 0.3 | 1 |

In an embodiment, the graded epitaxial second structure depicted in the Table has a thickness of 80 nm. In an embodiment, the graded epitaxial second structure depicted in the Table has a thickness of 600 nm.

Figure 3:
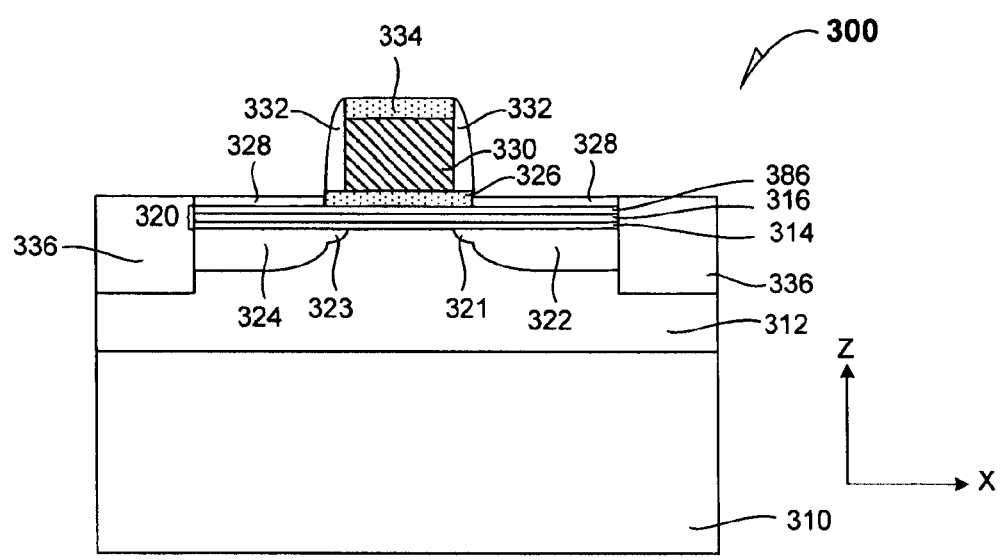
FIG. 3 is a cross-section elevation of a transistor apparatus according to an example embodiment.

FIG. 3 is a cross-section elevation of a transistor apparatus 300 according to an example embodiment. A semiconductive substrate 310 carries an epitaxial first structure 312. In an embodiment, the epitaxial first structure is a III-V semiconductive material to become a quantum well channel. An epitaxial second structure 320 is disposed above and on the epitaxial first structure 312. The epitaxial second structure 320 includes at least a first layer 314 and a subsequent layer 386. As illustrated according to an embodiment, the epitaxial second structure 320 includes a first layer 314, a second layer 316, and a subsequent layer 386. In an embodiment the subsequent layer 386 is up to a $30^{th}$ layer in a sequence after the first layer 314 according to the several embodiments set forth similarly to those disclosed for FIG. 1b.

The transistor apparatus 300 may be processed with source- and drain wells 322 and 324, respectively. In an embodiment, the source well 322 may have a tip 321 that may be formed before completion of the transistor. Similarly in an embodiment, the drain well 324 may also have a tip 323.

A high-k gate dielectric film 326 is formed above and on the epitaxial second structure 320. The interface that forms between the high-k gate dielectric film 326 and the epitaxial second structure 320 is the semiconductor/dielectric interface. In an embodiment, the high-k gate dielectric film 326 has a thickness from 20 Å to 60 Å. In an embodiment, the high-k dielectric film 326 is hafnium oxide ($HfO_2$). In an embodiment, the high-k dielectric film 326 is alumina ($Al_2O_3$). In an embodiment, the high-k dielectric film 326 is tantalum pentaoxide ($Ta_2O_5$). In an embodiment, the high-k dielectric film 326 is zirconium oxide ($ZrO_2$). In an embodiment, the high-k dielectric film 326 is lanthanum aluminate ($LaAlO_3$). In an embodiment, the high-k dielectric film 326 is gadolinium scandate ($GdScO_3$). As used herein, the phrase "high-k" refers to materials having a dielectric constant, k, greater than that of silicon dioxide, that is, greater than about 4.

The transistor apparatus 300 is further processed by forming a contact layer 328 above the epitaxial second structure 320. The contact layer 328 provides source- and drain contact structures with low contact resistance. In an embodiment, the contact layer 328 is formed of $In_xGa_{1-x}As$. For an NMOS transistor 300 the contact layer 328 is n+ doped. The contact layer 328 may also be n++ doped. In an embodiment, the contact layer 328 is doped by grading, starting with silicon doped with $In_{0.53}Ga_{0.47}As$, and proceeding from $In_xGa_{1-x}As$ from x=0.53 to 1.0 such that grading terminates with InAs. For a PMOS transistor 300, the contact layer 328 is p+ doped. In an embodiment, graded doping is done with a p+ doping gradient. The contact layer 328 may have a thickness between 10 nm and 30 nm according to an embodiment. The contact layer 328 has a thickness of 20 nm according to an embodiment.

A metal gate 330 is formed above and on the high-k gate dielectric film 326. In an embodiment, the metal gate 330 is a titanium (Ti) material. In an embodiment, the metal gate 330 is a platinum (Pt) material. In an embodiment, the metal gate 330 is a gold (Au) material. In an embodiment, the metal gate 330 is a combination of at least two of titanium, platinum, and gold. In an embodiment, the metal gate 330 has a thickness (Z-direction) from 60 Å to 140 Å. In an embodiment, the metal gate 330 has a thickness of 100 Å. In an embodiment, the high-k gate dielectric film 326 has a thickness of 100 Å and the metal gate 330 has a thickness of 100 Å. Further gate structure includes spacers 332 and a dielectric cap layer 334. In an embodiment, the transistor 300 is isolated by shallow-trench isolation 336 structures.

Figure 4:
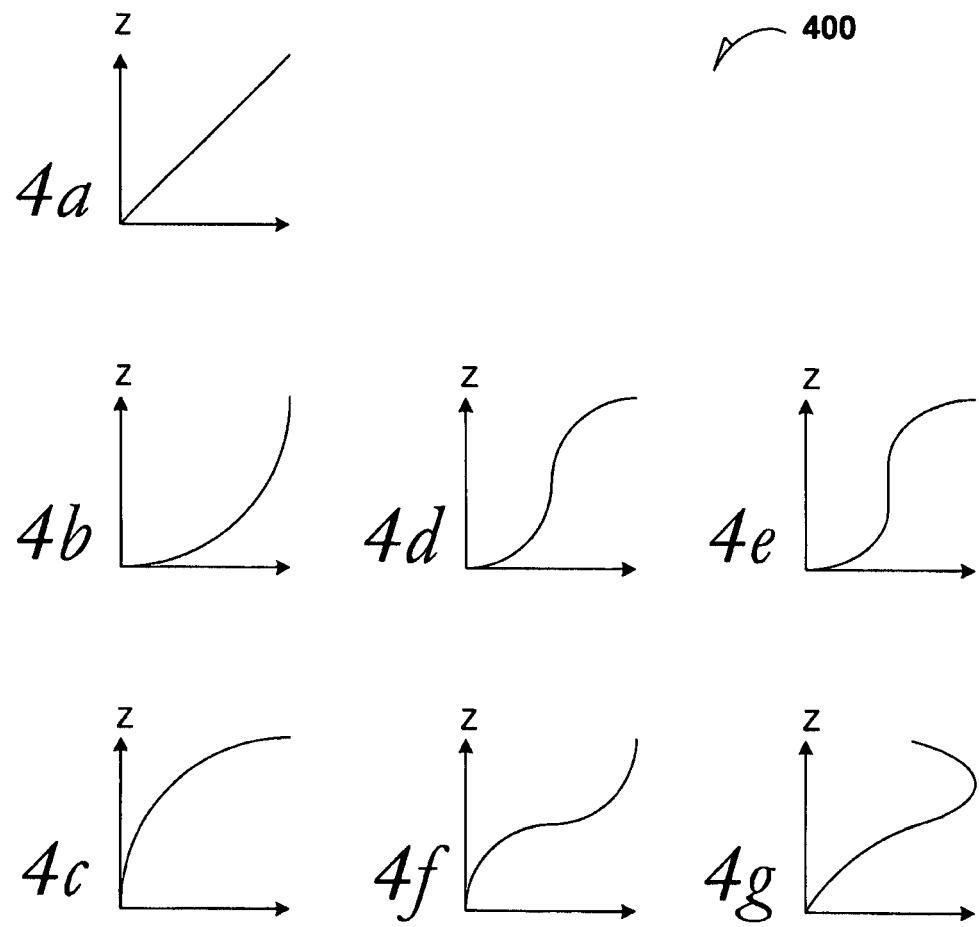
FIGS. 4a-4g depicts graphical representations of the chemical similarity for the sequences of layers that constitute epitaxial second structure embodiments.

FIG. 4 depicts graphical representations of the chemical similarity for the sequences of layers that constitute epitaxial second structure embodiments. In an embodiment, the epitaxial second structure is disposed on the epitaxial first structure and the epitaxial second structure is a sequential composite including a first layer and a subsequent layer. In an embodiment, the epitaxial second structure includes graded $In_xGa_{1-x}Sb$ and the subsequent layer is up to a 30th layer after the first layer according to any of the several disclosed embodiments.

In FIG. 4a, a sequential composite of layers is represented that have a linear composition gradient. The abscissa coordinate (Z-coordinate) and the ordinate coordinate (other linear composition gradient coordinate) are given in arbitrary units. At the origin of the graphic representation, the concentration is represented as the ordinate, and the distance from the epitaxial first structure to the top (e.g. top 118 in FIG. 1b) of the epitaxial second structure as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient in the epitaxial second structure is linear from the first layer to the subsequent layer. Other disclosed layer count embodiments are also useful second structure embodiments.

In FIG. 4b, a sequential composite of layers is represented that have a positive (increasing) exponential composition gradient. The ordinate and abscissa coordinates are given in arbitrary units. At the origin of the graphic representation, the concentration is represented as the ordinate, and the distance from the epitaxial first structure to the top of the epitaxial second structure is represented as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient is increasing exponentially beginning at the first layer and ending at the subsequent layer. Other disclosed layer count embodiments are also useful second structure embodiments.

In FIG. 4c, a sequential composite of layers is represented that have a negative (decreasing) exponential composition gradient. The ordinate and abscissa are given in arbitrary units. At the origin of the graphic representation, the concentration is represented as the ordinate, and the distance from the epitaxial first structure to the top of the epitaxial second structure is represented as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient is decreasing exponentially beginning at the first layer and ending at the subsequent layer. Other disclosed layer count embodiments are also.

In FIG. 4d, a sequential composite of layers is represented that have a positive and a negative exponential composition gradient that includes an inflection. The ordinate and abscissa are given in arbitrary units. At the origin of the graphic representation, the concentration is represented as the ordinate, and the distance from the epitaxial first structure to the top of the epitaxial second structure is represented as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient is first increasing beginning at the first layer and then decreasing after an inflection to end at the subsequent layer. Other disclosed layer count embodiments are also useful second structure embodiments.

In FIG. 4e, a sequential composite of layers is represented that have a positive and a negative exponential composition gradient that includes an inflection and an asymptote. The ordinate and abscissa are given in arbitrary units. At the origin of the graphic representation, the concentration is represented as the ordinate, and the distance from the epitaxial first structure to the top of the epitaxial second structure is represented as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient is first increasing beginning with the first layer and then decreasing after an inflection and an asymptote to end at the subsequent layer. Other disclosed layer count embodiments are also useful second structure embodiments.

In FIG. 4f, a sequential composite of layers is represented that have a negative and a positive exponential composition gradient that includes an inflection. The ordinate and abscissa are given in arbitrary units. At the origin of the graphic representation, the concentration is represented as the ordinate, and the distance from the epitaxial first structure to the top of the epitaxial second structure is represented as the abscissa. In an embodiment, the semiconductive substrate is an InP material, the epitaxial first structure includes $In_{0.7}Ga_{0.3}As$, and the epitaxial second structure is up to a $30^{th}$ layer after the first layer that includes $In_{0.3}Ga_{0.7}As$. The concentration gradient beginning at the first layer is first decreasing exponentially and then increasing exponentially after an inflection to end at the subsequent layer. Other disclosed layer count embodiments are also useful second structure embodiments.

In FIG. 4g, a sequential composite of layers is represented includes an inflection and a relational concentration where the concentration reverses to a degree to reach the subsequent layer. It should be clear that several variations of linear, exponential, asymptotic, and reverse-relational sequences may be combined according to specific design needs.

Various structures may be used for a surface-channel transistor. Selected chemistries may include III-V semiconductive material. In an example embodiment, the epitaxial second structure is 80 nm thick, includes 20 layers, and exhibits a sequential grading profile depicted in FIG. 4a. In an example embodiment, the epitaxial second structure is 60 nm thick, includes 30 layers, and exhibits a sequential grading profile depicted in FIG. 4e.

In an embodiment, the transistor apparatus includes the epitaxial second structure with a sequential composite of graded $In_xGa_{1-x}$ according to any of the embodiments depicted in FIG. 4 and their art-recognized equivalents In an embodiment, the transistor apparatus includes the epitaxial second structure with a sequential composite of graded $In_xSb_{1-x}$ according to any of the embodiments depicted in FIG. 4 and their art-recognized equivalents. Similarly, each sequential composition gradation embodiment may be combined with each disclosed quantitative layer number and overall thickness embodiment.

In an embodiment, the transistor apparatus includes the epitaxial first structure of $In_{0.7}Ga_{0.3}As$ and the subsequent layer includes a sequential composite of $In_{0.3}Ga_{0.7}As$ according to any of the embodiments depicted in FIG. 4 and their art-recognized equivalents. Similarly, each sequential composition gradation embodiment may be combined with each disclosed quantitative layer number and overall thickness embodiment.

In an embodiment, the transistor apparatus includes the epitaxial first structure of $Si_xGe_{1-x}$ and the subsequent layer is a sequential composite on a linear progression up to a 30th layer and is Si or is approaching Si in composition from SiGe. The various embodiments of sequential composite gradation as depicted in FIG. 4 are also applied to this chemistry. Similarly, each sequential composition gradation embodiment may be combined with each disclosed quantitative layer number and overall thickness embodiment.

In an embodiment, the transistor apparatus includes the epitaxial first structure made of $Al_{0.3}In_{0.7}Sb$ and the subsequent layer is a sequential composite of up to a 30th layer after the first layer, and the subsequent layer achieves or approaches $Al_{0.7}In_{0.3}Sb$. The various embodiments of sequential composite gradation as depicted in FIG. 4 are also applied to this chemistry. Similarly, each sequential composition gradation embodiment may be combined with each disclosed quantitative layer number and overall thickness embodiment.

In an embodiment, the transistor apparatus includes the epitaxial first structure made of $Al_{0.3}Ga_{0.7}As$, the subsequent layer is up to a 30th layer after the first layer, and the subsequent layer includes $Al_{0.7}Ga_{0.3}As$. The various embodiments of sequential composite gradation as depicted in FIG. 4 are also applied to this chemistry. Similarly, each sequential composition gradation embodiment may be combined with each disclosed quantitative layer number and overall thickness embodiment.

Figure 5:
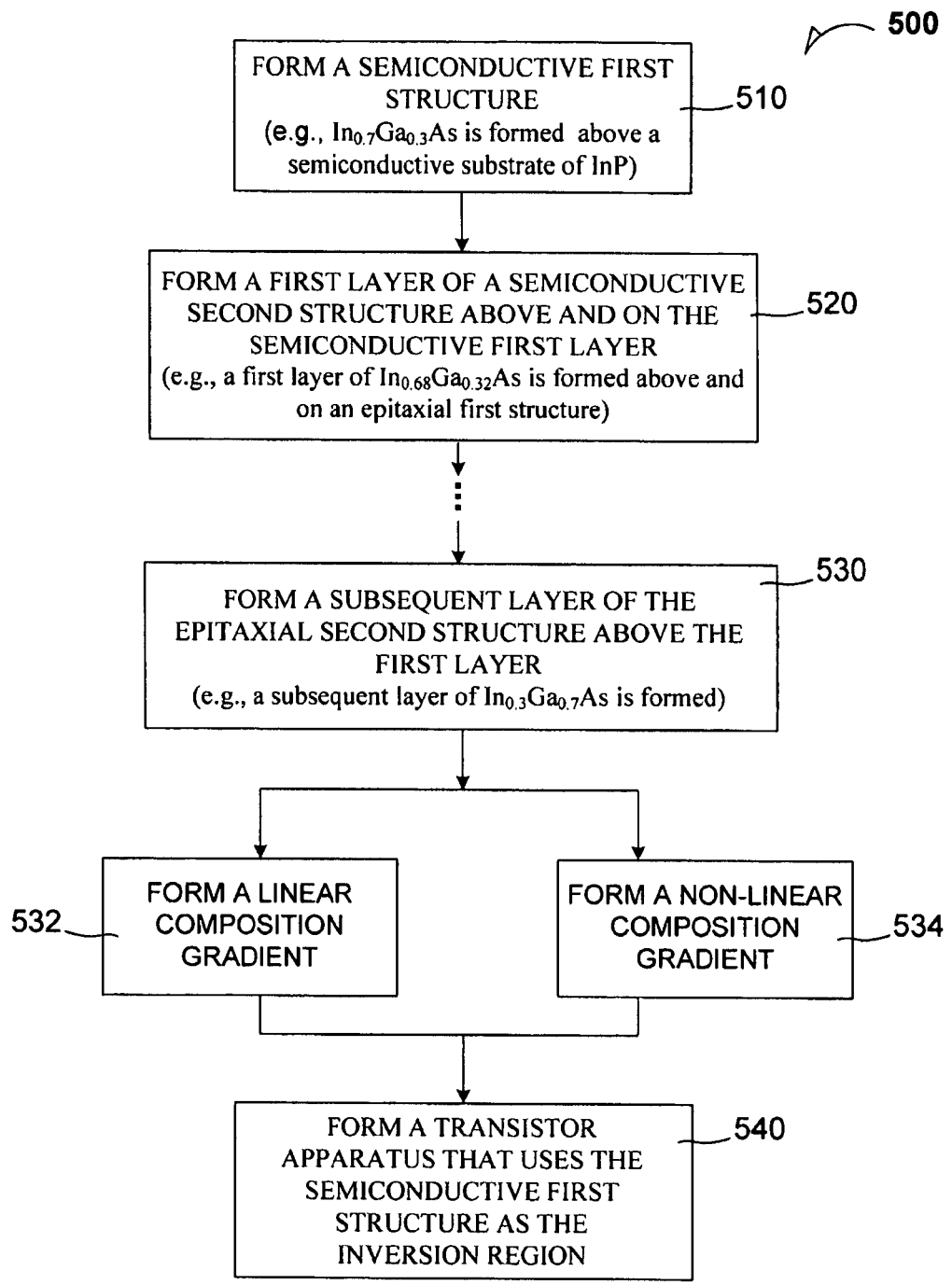
FIG. 5 is a process flow diagram according to an embodiment.

FIG. 5 is a process flow diagram 500 according to example embodiments.

At 510, the process includes forming a semiconductive first structure. In an example embodiment, an epitaxial first structure of $In_{0.7}Ga_{0.3}As$ is formed above a semiconductive substrate of InP as depicted in FIG. 1a.

At 520, the process includes forming a first layer of an epitaxial second structure above and on the semiconductive first structure. In an example embodiment, a first layer of $In_{0.68}Ga_{0.32}As$ is formed above and on an epitaxial first structure of $In_{0.7}Ga_{0.3}As$ as depicted in FIG. 1b.

At 530, the process includes forming a subsequent layer of the epitaxial second structure above the first layer. In an example embodiment, a subsequent layer of $In_{0.3}Ga_{0.7}As$ is formed above the first layer of $In_{0.68}Ga_{0.32}As$.

At 532, the process includes forming a linear composition gradient between the first layer and the subsequent layer. In an example embodiment, a composition gradient that qualitatively matches the illustration of FIG. 4a is achieved.

At 534, the process includes forming a non-linear (e.g. exponential) composition gradient between the first layer and the subsequent layer. In an example embodiment, a composition gradient that qualitatively matches the illustration of FIG. 4b is achieved. In an example embodiment, a composition gradient that qualitatively matches the illustration of FIG. 4c is achieved. In an example embodiment, a composition gradient that qualitatively matches the illustration of FIG. 4d is achieved. In an example embodiment, a composition gradient that qualitatively matches the illustration of FIG. 4e is achieved. In an example embodiment, a composition gradient that qualitatively matches the illustration of FIG. 4f is achieved. In an example embodiment, a composition gradient that qualitatively matches the illustration of FIG. 4g is achieved.

It may now be understood that the nonlinear composition gradient embodiments may be discrete approximations of nonlinear composition gradients. for example, a 30-layer non-linear composition gradient may be viewed by fitting a curve to the changing chemistry in each layer. In an embodiment, two linear composition gradients may be combined to be curve fit to appear similar to the qualitative effects of FIG. 4b or FIG. 4c.

At 540, the process includes forming a transistor apparatus that uses the semiconductive first structure as an inversion region. In an example embodiment, a transistor apparatus 300 is formed with an epitaxial first structure 312 and an epitaxial second structure 320 as depicted in FIG. 3.

Figure 6:
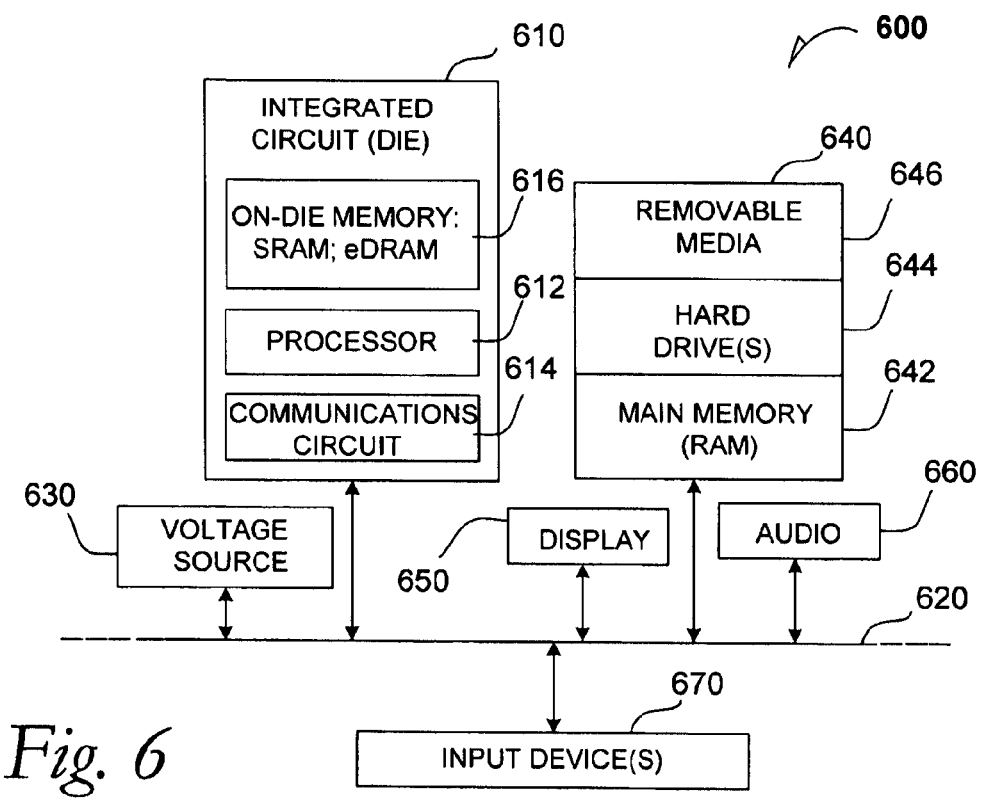
FIG. 6 is a schematic of an electronic system according to an embodiment.

FIG. 6 is a schematic of an electronic system 600 according to an embodiment. The electronic system 600 as depicted can embody a transistor apparatus with a compositionally graded sequence of thin layers embodiments disposed above a semiconductive first structure as set forth in this disclosure. In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. Other types of circuits that can be included in the integrated circuit 610 are a custom circuit or an application-specific integrated circuit (ASIC), such as a communications circuit 614 for use in wireless devices such as cellular telephones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM) that can be a cache memory for the processor.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory keys, and other removable media known in the art. The various memory functionalities can contain transistor apparatus with a compositionally graded sequence of thin layers embodiments disposed above a semiconductive first structure.

In an embodiment, the electronic system 600 also includes a display device 650, an audio output 660. In an embodiment, the electronic system 600 includes a controller 670, such as a keyboard, mouse, trackball, game controller, microphone, voice-recognition device, or any other device that inputs information into the electronic system 600.

As shown herein, the integrated circuit 610 can be implemented in a number of different embodiments, including a transistor apparatus with a compositionally graded sequence of thin layers embodiments disposed above a semiconductive first structure, an electronic system, a computer system, one or more methods of fabricating an integrated circuit, and one or more methods of fabricating an electronic assembly that includes a transistor apparatus with a compositionally graded sequence of thin layers embodiments disposed above a semiconductive first structure as set forth herein in the various embodiments and their art-recognized equivalents. The elements, materials, geometries, dimensions, and sequence of operations can all be varied to suit particular transistor apparatus with a compositionally graded sequence of thin layers embodiments disposed above a semiconductive first structure.

Although a processor chip and a memory chip may be mentioned in the same sentence, it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a transistor apparatus, comprising:
forming a first structure of a semiconductive first type;
forming an epitaxial second structure above the first structure, wherein the second structure includes a first layer disposed above and on the first structure, and a subsequent layer of a semiconductive second type that is different from the semiconductor first type that is disposed in a series above the first layer, wherein the subsequent layer is up to a $30^{th}$ layer after the first layer;
forming a gate dielectric layer above and on the subsequent layer; and
forming a metal gate above and on the gate dielectric layer, and wherein forming the second structure results in a semiconductor second type gradient wherein the first layer is more semiconductively similar to the first structure than to the subsequent layer, and wherein the first layer and the first structure have different stoichiometric percentages of the same elements.

2. The process of claim 1, further including:
forming the first structure above and on a semiconductive substrate;
wherein the epitaxial second structure is formed by MBE growth.

3. The process of claim 1, further including:
wherein the epitaxial second structure is formed by MBE growth; and
wherein forming the gradient results in a linear profile gradient.

4. The process of claim 1, further including:
wherein the epitaxial second structure is formed by MBE growth; and
wherein forming the gradient results in an exponential profile gradient.

5. The process of claim 1, further including:
wherein the semiconductive second type gradient includes a graded $In_xGa_{1-x}Sb$ material.

6. The process of claim 1, further including:
Wherein the semiconductive second type gradient includes $In_xGa_{1-x}Sb$ material.

7. The process of claim 1, further including:
wherein forming the gradient results in a linear profile gradient.

8. The process of claim 1, further including:
wherein forming the gradient results in an exponential profile gradient.

9. The process of claim 1, further including:
wherein forming the gradient results in a negative exponential profile gradient.

10. The process of claim 1, further including:
wherein forming the gradient results in a gradient including positive and a negative exponential profile gradient that includes an inflection point.

11. The process of claim 10, further including:
wherein the gradient further includes an asymptote.

12. The process of claim 1, further including:
wherein forming the gradient results in a gradient including an inflection and a relational concentration where the concentration reverses to a degree to reach the subsequent layer.

13. The process of claim 1, further including:
wherein the second epitaxial structure is formed by MBE, CVD, MOCVD, UHCVD, or LPE.

14. The process of claim 1, further including:
wherein the total thickness of the second epitaxial structure is between 20 nm and 100 nm.

* * * * *